(12) United States Patent
Rhodes (10) Patent No.: US 8,183,515 B2
(45) Date of Patent: May 22, 2012

(54) PUMPS FOR CMOS IMAGERS

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/727,036

(22) Filed: Mar. 18, 2010

(65) Prior Publication Data

US 2010/0258709 A1    Oct. 14, 2010

Related U.S. Application Data

(63) Continuation of application No. 10/461,440, filed on Jun. 16, 2003, now Pat. No. 7,709,777.

(51) Int. Cl.
- *H01J 40/14* (2006.01)
- *H01L 27/00* (2006.01)
- *H04N 3/14* (2006.01)

(52) U.S. Cl. .................. 250/214 R; 250/208.1; 348/308

(58) Field of Classification Search ............... 250/208.1, 250/214.1, 214 R, 214 C, 214 LA, 214 A, 250/214 LS, 214 AG, 214 AL, 214 SW, 216; 257/231, 236, 239, 204, 207, 208, 225–229, 257/257–258, 290–291, 299; 348/294, 297, 348/298–302, 307–311, 241; 327/536
See application file for complete search history.

(56) References Cited

U.S. PATENT DOCUMENTS

| | | |
|---|---|---|
| 4,374,700 A | 2/1983 | Scott et al. |
| 4,820,936 A | 4/1989 | Veendrick et al. |
| 5,038,325 A | 8/1991 | Douglas et al. |
| 5,126,692 A | 6/1992 | Shearer et al. |
| 5,319,604 A | 6/1994 | Imondi et al. |
| 5,355,028 A | 10/1994 | O'Toole |
| 5,461,425 A | 10/1995 | Fowler et al. |
| 5,469,484 A * | 11/1995 | Sato et al. ........................ 377/58 |
| 5,471,515 A | 11/1995 | Fossum et al. |
| 5,541,402 A | 7/1996 | Ackland et al. |
| 5,576,763 A | 11/1996 | Ackland et al. |
| 5,612,799 A | 3/1997 | Yamazaki et al. |
| 5,614,744 A | 3/1997 | Merrill |
| 5,625,210 A | 4/1997 | Lee et al. |
| 5,689,208 A | 11/1997 | Nadd |
| 5,705,846 A | 1/1998 | Merrill |
| 5,708,263 A | 1/1998 | Wong |
| 5,757,045 A | 5/1998 | Tsai et al. |

(Continued)

FOREIGN PATENT DOCUMENTS

WO    WO 03/019829 A2    3/2003

OTHER PUBLICATIONS

Raj Nair, "Signal Processing in CMOS Image Sensors", 2000 IEEE, pp. 801-810.

(Continued)

*Primary Examiner* — Georgia Y Epps
*Assistant Examiner* — Don Williams
(74) *Attorney, Agent, or Firm* — Dickstein Shapiro LLP (57) ABSTRACT

A pixel for an imaging device is described. The pixel includes a photosensitive device provided within a substrate for providing photo-generated charges, a circuit associated with the photosensitive device for providing at least one pixel output signal representative of the photo-generated charges, the circuit includes at least one operative device that is responsive to a first control signal during operation of the associated circuit and a pump circuit. The pump circuit may include substrate pumps, charge pumps and/or voltage pumps. The pixel may also be embedded in an imaging system.

26 Claims, 12 Drawing Sheets

U.S. PATENT DOCUMENTS

| | | | |
|---|---|---|---|
| 6,140,630 | A | 10/2000 | Rhodes |
| 6,559,721 | B2 * | 5/2003 | Ausserlechner et al. ..... 330/264 |
| 6,731,155 | B2 * | 5/2004 | Hakkarainen et al. ........ 327/390 |
| 6,864,920 | B1 * | 3/2005 | Kindt et al. ................... 348/308 |
| 6,891,145 | B2 * | 5/2005 | Bock .......................... 250/214 R |
| 2002/0053942 | A1 * | 5/2002 | Tanimoto ...................... 327/536 |
| 2002/0085106 | A1 | 7/2002 | Beiley et al. |
| 2002/0140689 | A1 | 10/2002 | Huang et al. |

OTHER PUBLICATIONS

Dickinson, A., et al., *A 256×256 CMOS Active Pixel Image Sensor with Motion Detection*, 1995 IEEE International Solid-State Circuits Conference, pp. 226-227.

Dickinson, A., et al., *Standard CMOS Active Pixel Image Sensors for Multimedia Applications*, Proceedings of Sixteenth Conference on Advanced Research in VLSI, Mar. 27-29, 1995, pp. 214-224.

Eid, E-S., et al., *A 256 × 256 CMOS Active Pixel Image Sensor*, Proc. SPIE vol. 2415, Apr. 1995, pp. 265-275.

Fossum, E., et al., *IEDM A 37×28mm² 600k-Pixel CMOS APS Dental X-Ray Camera-on-a-Chip with Self-Triggered Readout*, 1998 IEEE International Solid-State Circuits Conference, pp. 172-173.

Gerrit W Den Besten et al: "Embedded 5 V-to-3.3 V Voltage Regulator for Supplying Digital IC's in 3.3 V CMOS Technology", IEEE Journal of Solid-State Circuits, IEEE Service Center, Piscataway, NJ, US, vol. 33, No. 7, Jul. 1, 1998, XP011060759, ISSN: 0018-9200.

* cited by examiner

PUMPS FOR CMOS IMAGERS

This application is a continuation of application No. 10/461,440, filed Jun. 16, 2003 now U.S. Pat. No. 7,709,777, which is hereby incorporated by reference in its entirety.

FIELD OF THE INVENTION

The invention relates to a CMOS imager having an array of image sensing cells and to the driving signals, which operate the cells. In particular, the present invention relates to the use of a variety of pumps in CMOS imagers.

BACKGROUND OF THE INVENTION

CMOS imagers are low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with, for example, the conventional CCD since standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photodiodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12) pp. 2046-2050, 1996; Mendis et al, "CMOS Active Pixel Image Sensors," IEEE Transactions on Electron Devices, Vol. 41(3) pp. 452-453, 1994 as well as U.S. Pat. Nos. 5,708,263 and 5,471,515, which are herein incorporated by reference.

It should be understood that the CMOS imager may include a photodiode or other image to charge converting device, in lieu of a photogate, as the initial accumulator for photo-generated charge.

Figure 1:
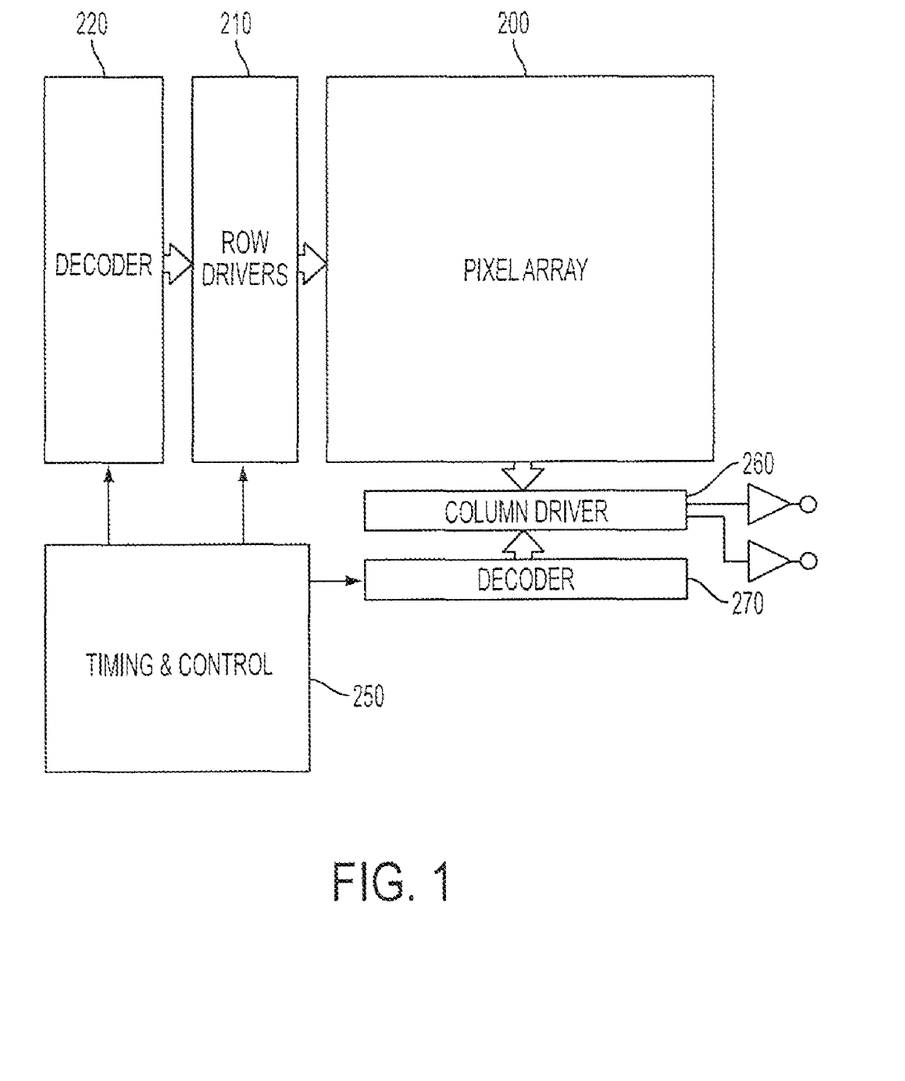
FIG. 1 is a block diagram of a CMOS active pixel sensor chip.
Figure 2A:
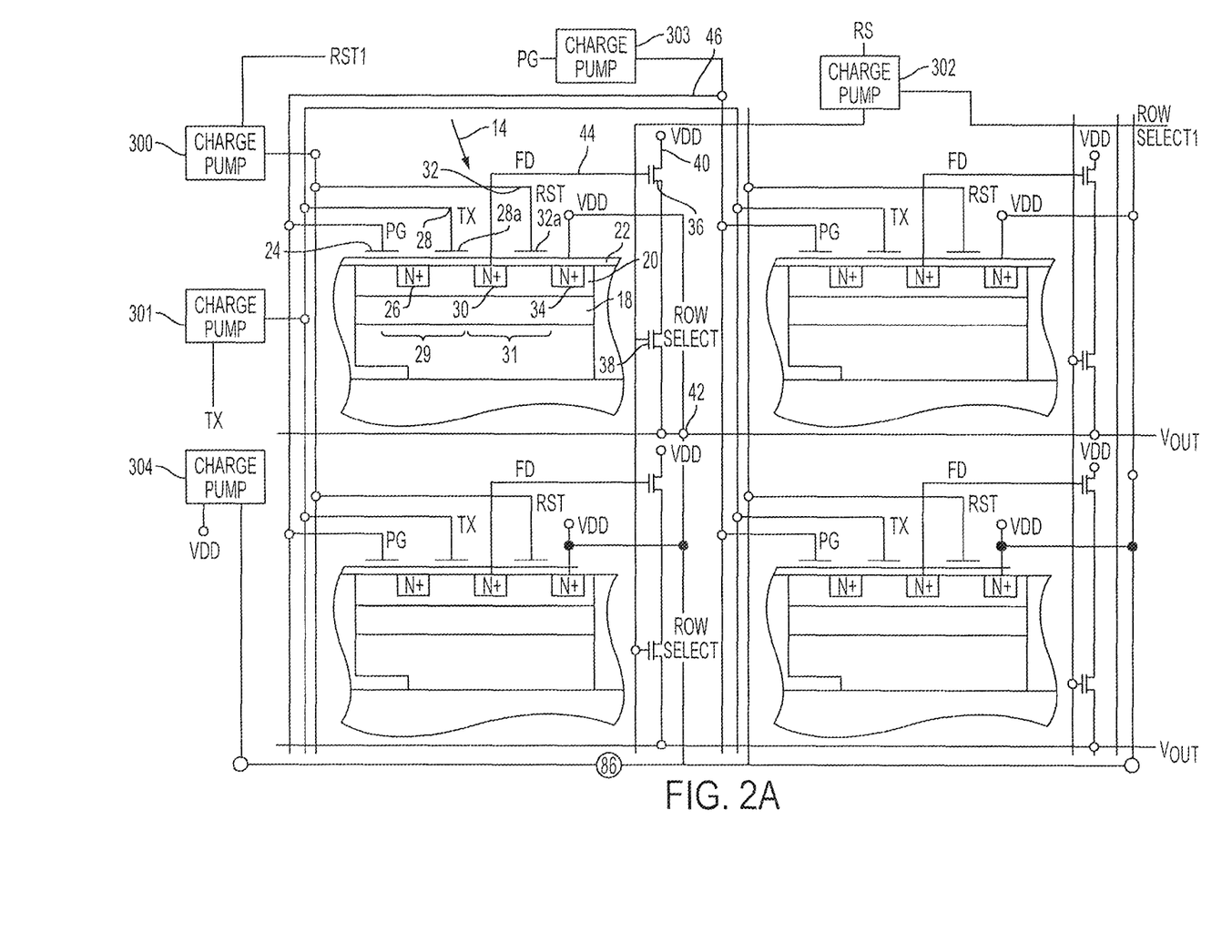
FIG. 2A is a representative pixel layout showing a 2×2 pixel layout according to one embodiment of the present invention.

FIG. 1 illustrates a block diagram for a CMOS imager having a pixel array 200. FIG. 2A shows a 2×2 portion of pixel array 200. Pixel array 200 (FIG. 1) comprises a plurality of pixels arranged in a predetermined number of columns and rows. The pixels of each row in array 200 are all turned on at the same time by a row select line, e.g., line 86 (see FIG. 2A), and the pixel signal output, $V_{out}$, of each column is selectively clocked onto a column select line, e.g., $V_{out}$, line 42 (see FIG. 2A). A plurality of row and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

The operation of the charge collection of the CMOS imager is known in the art and is described in several publications such as Mendis et al., "Progress in CMOS Active Pixel Image Sensors," SPIE Vol. 2172, pp. 19-29, 1994; Mendis et al., "CMOS Active Pixel Image Sensors for Highly Integrated Imaging Systems," IEEE Journal of Solid State Circuits, Vol. 32(2), 1997; and Eric R, Fossum, "CMOS Image Sensors: Electronic Camera on a Chip," IEDM Vol. 95 pages 17-25 (1995) as well as other publications. These references are incorporated herein by reference.

The use and operation of a $V_{cc}$ charge pump for CMOS Imagers is described in U.S. Pat. No. 6,140,630, incorporated in its entirety herein by reference.

Prior art CMOS imagers are not without their shortcomings. For example, these CMOS imagers experience leakage in the transfer gate. Furthermore, it would be desirable to provide a variety of pumps including pixel voltage pump so that the CMOS imager array operating voltage could be different from a periphery supply voltage, positive and/or negative pumps, and substrate pumps.

SUMMARY OF THE INVENTION

The deficiencies of the prior art are overcome by driving one or more of the reset gate, transfer gate (if used) and the row select gate with one or more pumps. A voltage pump provides a higher voltage than the supply voltage $V_{dd}$ to improve the gating operation of the reset, transfer (if used) and row select transistors. By overdriving one or more of the gates of the reset, transfer and row select transistors with the output of a voltage pump, pixel to pixel fabrication differences in electrical characteristics of these transistors can also be avoided. Moreover, if a photogate is used to acquire image charges this too may be overdriven by an output voltage from a voltage pump. The above are examples of gates that can benefit from a voltage pump but should not be taken to be limiting.

Additionally, incorporation of a negative pump to CMOS imager gates such as a reset gate, a row select gate or a transfer gate (if used) allows the current off, $I_{off}$, performance of these gates to improve as well as the overall image performance of the CMOS imager to improve. This also allows the gate length to shrink and more die/wafer is achieved without sacrificing imager performance. The above are examples of gates that can benefit from a negative pump but should not be taken to be limiting.

Additionally, a substrate pump is described, where the pixels of the array are linked through the substrate.

The above and other advantages and features of the invention will be more clearly understood from the following detailed description which is provided in connection with the accompanying drawings.

DETAILED DESCRIPTION OF THE INVENTION

Figure 3:
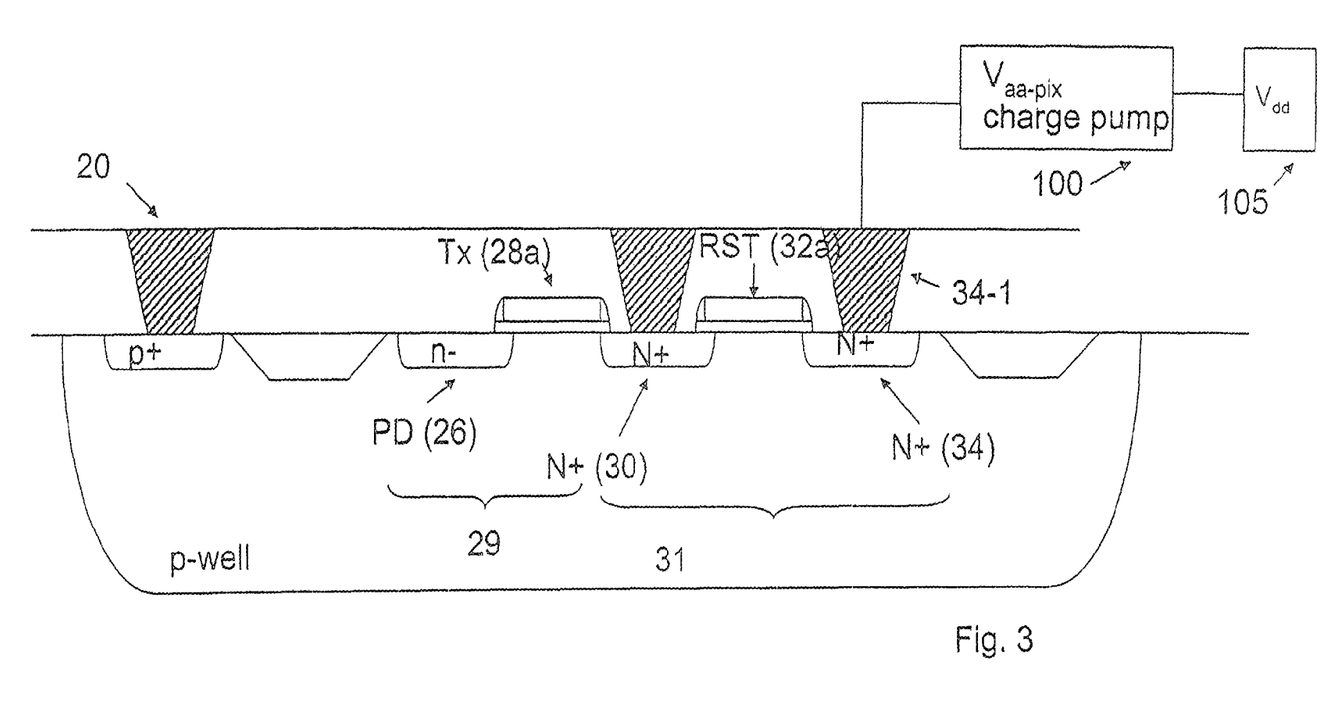
FIG. 3 is an exploded view of a four transistor (4T) pixel of FIG. 2 using a $V_{aa\text{-}pix}$ charge pump in accordance with the present invention.

The present invention will now be described with reference to the figures. Reference is now made to FIG. 2A. This figure shows a portion of an active pixel array constructed according to the present invention in which respective charge pumps 300, 301 and 302 are used to supply the gate voltages for the reset transistor, transfer gate transistor and row select transistors 31, 29 and 38. As shown in FIG. 3, reset transistor 31 is formed by n+ region 30 and n+ region 34 and controlled by RST signal 32. Transfer transistor 29 is formed by n+ region 26 and n+ region 30 and controlled by TX signal 28. In FIG. 2A, charge pump 303 is shown for providing a gate voltage to a photogate 24 for charge transfer. Charge pump 304 is shown for providing a voltage pump to a N+junction, which is the $V_{dd}$ pixel supply junction in this case. This figure shows a 2×2 array of pixels for simplification. It should be understood that the invention is directed to a M×N multiple pixel array of any size.

The operation of the FIG. 2A pixel array will now be described. Photodetectors 14 of a row of pixels are coupled via their respective row select transistors 38 to column line 42. The photodetector selected by a row decoder via line 86 will provide electrical current depending upon the voltage at the gate of source follower transistor 36 supplied by floating diffusion node 30. As noted, the gate of transistor 36 controls the current through load transistor 39 (not shown in FIG. 2A) and in consequence the voltage on column line 42.

Signal ROW SELECT turns row select transistor 38 on. The voltage controlled by the row select signal on line 86 is a charge pump 302 output voltage. Row select line 86 is connected to charge pump 302 to overdrive the row select transistor 38, that is, the gate voltage of transistor 38 is higher than the $V_{dd}$ supply voltage. In a $V_{dd}$ system, charge pump 302 will supply $V_{pump} > V_{dd}$ volts to the gate of row select transistor 38. In the absence of a charge pump on the reset gate, the reset gate RST turns on reset transistor 31, which causes the floating diffusion node 30 to be reset to a potential of $V_{dd} - V_{th}$, where $V_{th}$ is the threshold voltage of the reset transistor 31. The actual gate 32a to transistor 31 is supplied by charge pump 300 to overdrive the gate of the reset transistor 31 with a voltage of $V_{pump} > V_{dd}$ to achieve higher floating diffusion voltage reset value on node 30 at $V_{dd}$. By having a higher reset voltage available at node 30, a wider dynamic response range is available for the pixel output signal and variation in the voltage at which the floating diffusion node 30 is reset due to the reset transistor 31 $V_{th}$ variation is reduced.

The photogate 24 is also supplied from a charge pump 303, ensuring that all possible collected charge for an image signal is stored in the imager substrate beneath the photogate until it is to be transferred out of the collection area.

The FIG. 2A circuit shows use of a transfer gate 28a and associated transfer transistor 29. If the CMOS imager cells uses a transfer transistor, then the transfer gate 28a voltage is also supplied from a charge pump 301 in response to transfer signal TX, once again ensuring that the transfer transistor is overdriven to its on state and eliminating the $V_{th}$ voltage drop which normally occurs. The charge pump on the transfer gate enables improved charge transfer between the photosensor and the floating diffusion. The operation of the FIG. 2A circuit to acquire, transfer and output pixel charge is otherwise as previously described.

The charge pumps 300 and 301 provide voltage to the reset gate 32a and transfer gate 28a at a potential which is greater than the supply potential $V_{dd}$. The pumped voltage enhances the performance of the transfer and reset transistors. In order to turn "on" the various transistors of the pixel array, a gate voltage to the transistor must exceed a source or drain voltage (depending on the type of transistor) such that $V_{pump} > V_{dd}$. However, the threshold voltage ($V_{th}$) may differ for each transistor of a pixel array due to manufacturing imperfections. As a consequence, when all transistors of the array are turned "on" or "off" using the voltage supply potentials to supply control signals to the gates of the transistors, some transistors which are turned "on" are more "on" than other transistors thereby inconsistently transferring and/or amplifying the pixel charges transferred to the pixel output line 42.

Likewise, some of the transistors which are turned "off" are more "off" than other transistors causing leakage. This is reflected as an improper output of signals reflecting the charges collected by the photodetector circuit 14.

The charge pumps 300, 301 and 302 help to overcome the inconsistent on/off threshold voltages ($V_{th}$) of the transistors by overdriving the gates with voltages which ensure that they turn on or off as required, regardless of manufacturing inconsistencies. The charge pump 303 ensures that the maximum possible charges are collected in the collection region beneath the photogate.

While multiple charge pumps 300, 301, 302, 303 and 304 are shown in FIG. 2A for the entire CMOS pixel array, it should be understood that a single charge pump having multiple controlled output voltages may be used for the entire CMOS imager and for associated logic circuits. Also, individual charge pumps may be used for different portions of the imager circuit and for the associated logic circuits. Also, while the charge pumps 300, 301, 302, 303, 304 are shown supplying voltage for the reset gate, the transfer gate, the row select gate and the photogate and $V_{dd}$ supply, it should be understood that a charge pump may be used for one or more of these gates to achieve a benefit over conventional CMOS imagers which do not use a charge pump. It is understood that the present invention is not limited to the examples described herein. More complex 5T, 6T, 7T CMOS imagers are contemplated supporting global shutter, high dynamic range, and dual conversion gain applications. Pumped gates or diffusion will be advantageous in these applications as well. That is, a common charge pump source could be used to supply the high state voltage level to all pumped clocked gates (e.g. reset, row select, transfer, photogate and $V_{dd}$ supply) so long as $V_{pump} > V_{dd}$.

The particular construction of the charge pump is not critical to the invention and many circuits circuit can be used. Representative output voltages of charge pumps 300, 301, 302 and 303 are 4.0, 4.0 and 4.0, respectively, for a 3.3 volt $V_{dd}$ supply and assuming that the $V_d$, of each of these transistors is less than 0.7 volts. While it is advantageous to have $V_{pump} \geq V_{dd} V_{th}$ it is not required or limiting. The photogate pump when turned on by the positive clock pulse can be at a pumped voltage such that $V_{pump} > V_{dd}$. When the clock voltage applied to the photogate returns to its low or off-state voltage that off-state may be pumped low so that the gate sees a negative voltage. All of the other gates of the CMOS imager may benefit from having a negative pumped voltage applied to turn the transistor off. The negative voltage can be any value so long as it is lower than a reference ground (0V) potential. It should be understood that the output of voltage charge pumps 300, 301, 302, 303 and 304 may vary, individually, depending upon the $V_{dd}$ and/or $V_{ss}$ supply as well as the $V_d$, of the individual transistors. For collecting charge in the photogate, the charge pump 303 is configured to supply an output voltage $V_{pgp}$ where $V_{pgp}$ is greater than input voltage $V_{dd}$.

Figure 2B:
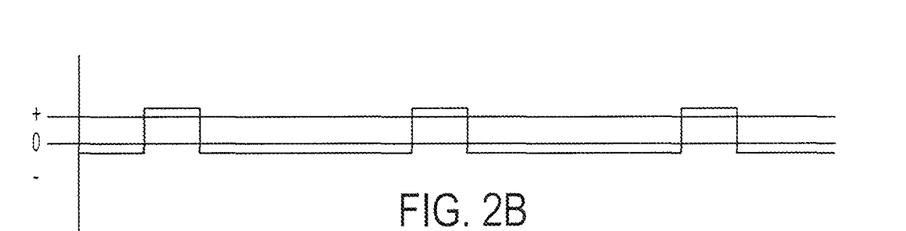
FIG. 2B shows a generalized signal applied to any gate of a CMOS imager.
Figure 2C:
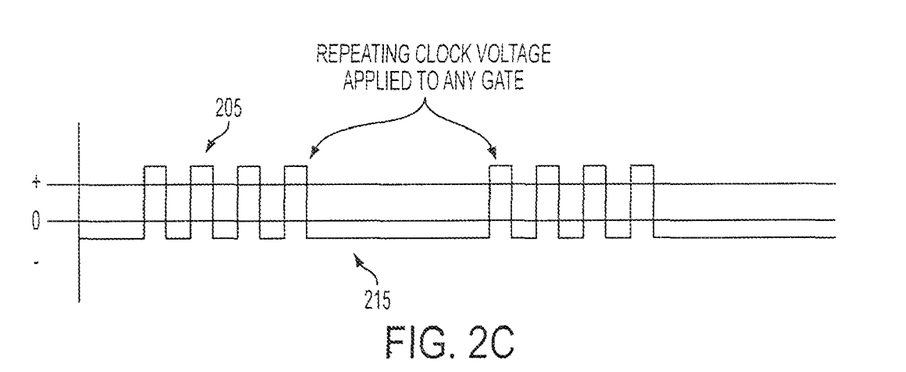
FIG. 2C shows a repeating clock voltage which can be applied to any gate of a CMOS imager.

FIG. 2B shows a generalized signal applied to any gate of a CMOS imager. FIG. 2C shows a repeating clock voltage which can be applied to any gate. The high state voltage 205 is pumped above $V_{dd}$ ($V_{pump} > V_{dd}$). The clock voltage applied returns to a low or off-state voltage 215 resulting in a pumped voltage that is below ground (0V).

The above discussion has described the circuit for an exemplary 2×2 pixel shown in FIG. 2A. It is desirable for an additional pump circuit to supply voltage $V_{aa\text{-}pix}$ to diffusion node 34 and through diffusion node 34 to floating diffusion node 30 so that the CMOS imager operating voltage could be different from a periphery supply voltage. The pump circuit includes a $V_{aa\text{-}pix}$, charge pump, which is supplied by external power supply $V_{dd}$. The pump circuit outputs a new supply voltage that is booted. The new booted $V_{aa\text{-}pix}$ supply then is used to supply all of the pixels. This permits the CMOS imager array to operate at a different voltage than the periphery.

As described above from $V_{dd}$ a voltage $V_{aa\text{-}pix}$ is created using a pump circuit such that $V_{aa\text{-}pix}, > V_{dd}$. The present invention also encompasses the situation where $V_{pump} < V_{dd}$ using a regulated power supply that is less than the supplied voltage source $V_{dd}$. In the alternative $V_{dd}$ could be a high state voltage such as depicted in FIG. 2B. From this high state voltage a regulated voltage $V_{reg}$ can be created, where the regulated voltage is a low state voltage. In this instance, $V_{dd}$ could supply the array and $V_{reg}$ could supply the periphery where $0 < V_{reg} < V_{dd}$.

Figure 2D:
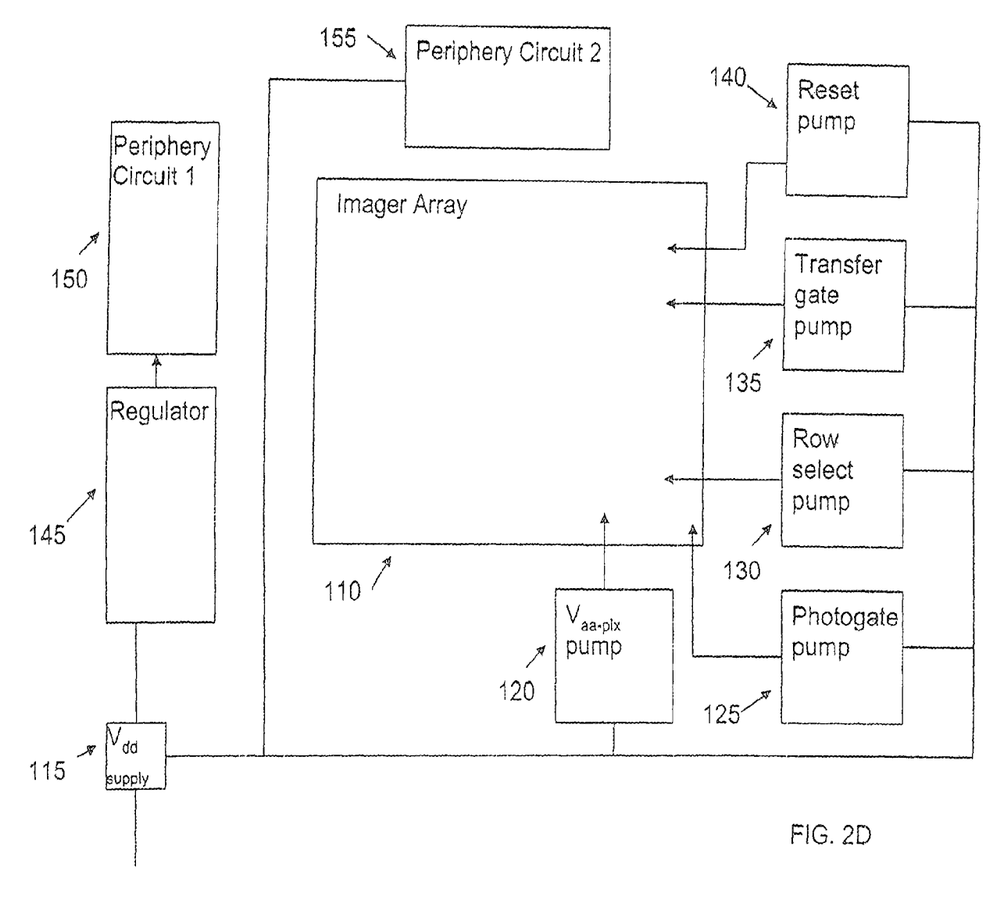
FIG. 2D is an exemplary embodiment of an external $V_{dd}$ supply as the input to five separate internal pumps.

FIG. 2D is an example of an external $V_{dd}$ supply 115 as the input to five separate internal pumps, $V_{aa\text{-}pix}$ pump 120, photogate pump 125, row select pump 130, transfer gate pump 135 and reset pump 140. These could be pumps to independently supply $V_{pump} > V_{dd}$ and/or they could supply a negative off-state voltage to the various shown clocked voltages driving the array transistor gates and diffusions of imager array 110. A regulator 145 is also shown providing a regulated voltage to the imager circuits in the periphery, such as periphery circuit 1 (150). If the external supply, is, for example, 3.3 volts, then the five shown array pumps can produce clocked voltages to the array such that $V_{pump} > V_{dd}$. In our examples if the $V_{th}$ of the array transistors is 0.7 volts then a reasonable $V_{pump}$ high voltage to the array gates would be 4.0 volts. The pumps could also include negative pumps to control the off-state voltage of the voltage clocks supplying the array circuits. To conserve power, in this example, the regulator is supplied at $V_{reg} < V_{dd}$ to support the circuits in the imager periphery. In this example $V_{reg}$ is the range of 2.5 V to 1.2 V might be reasonable. Periphery circuit 2 (155) in this example is driven directly by the $V_{dd}$ external supply. For example, periphery circuit 1 (150) could be digital circuits and periphery circuit 2 (155) could be analog circuits. In this example, the imager array 110 is provided with voltages greater than or equal to the supply voltage for the "high state" or "on" voltage of the array circuits. The periphery circuits 150, 155 are provided with voltages less than or equal to the supply voltage.

Figure 2E:
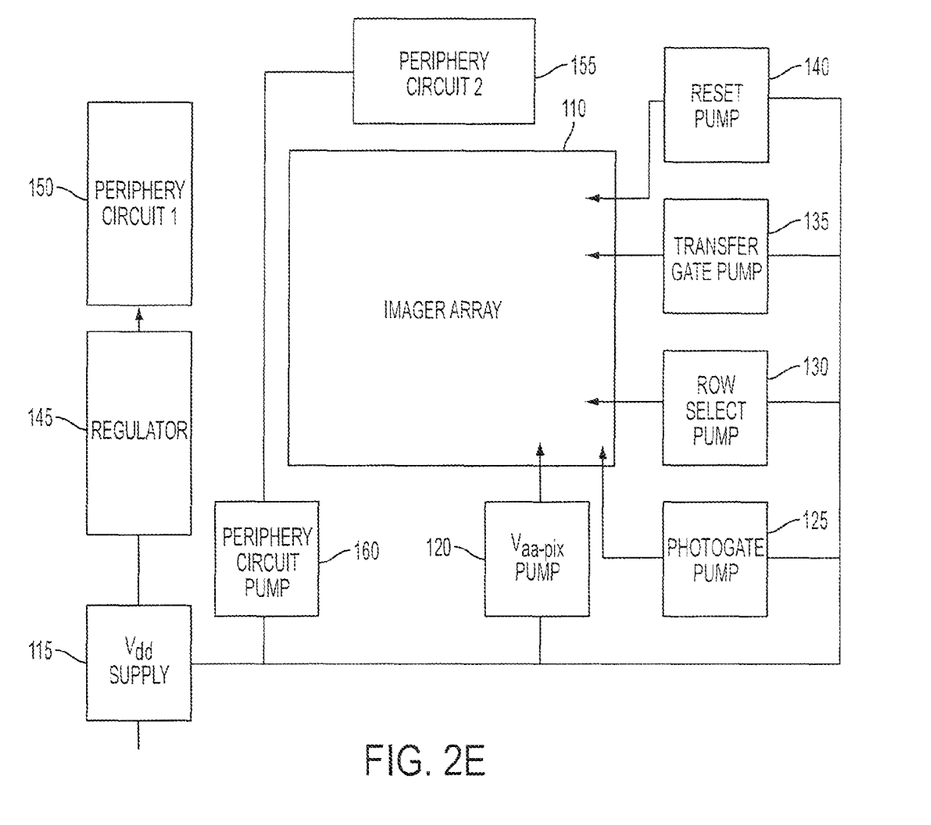
FIG. 2E is an exemplary embodiment of an external $V_{dd}$ supply at a lower voltage as the input to five separate internal pumps.

In FIG. 2E the external supply could be at a lower voltage of 2.5 volts. In this case it would be advantageous to have a periphery circuit pump 160 to increase the voltage supply to the analog circuits of periphery circuits 2 (155). It would also be possible to have a lower regulated voltage, $V_{reg} < V_{dd}$ (1.2. 1.5, 1.8, 2.0, 2.2 V) supplying the digital circuits in periphery circuits 1.

Figure 2F:
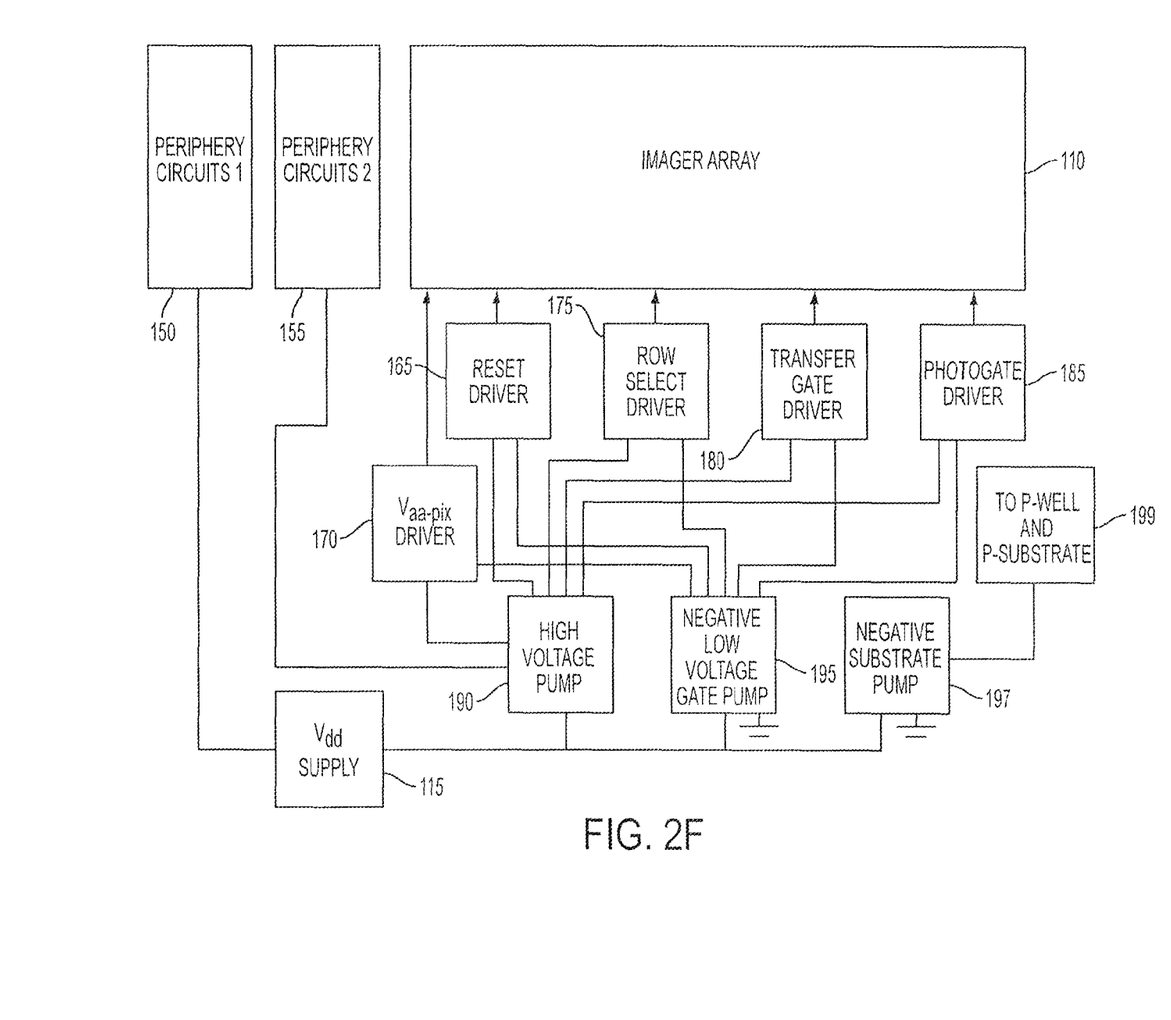
FIG. 2F is an example of an external $V_{dd}$ supply applied to a positive high voltage pump and a negative low voltage pump.

FIG. 2F is an example of an external $V_{dd}$ supply 115 applied to a positive high voltage pump 190, a negative low voltage gate pump 195 and a negative substrate pump 197. The negative substrate pump 197 supplies voltage to p-well and p-substrate 199. The positive high voltage pump 190 and the negative low voltage pump 195 each supply a reset driver 165, a row select driver 175, a transfer gate driver 180, a photogate driver 185 and a $V_{aa\text{-}pix}$ driver 170, each of which is coupled to the imager array 110. In this example, the positive high voltage pump 190 also supplies voltage to periphery circuits 2 (155). Periphery circuits 1 (150) is supplied directly by the external $V_{dd}$ supply 115.

The advantageous operation of CMOS imagers is described using a four transistor (4T) CMOS imager. Actual CMOS imagers may contain fewer or more than four transistors. It is understood that the use of 4T CMOS imagers is not meant to limit the present invention to a 4T embodiment. If the CMOS imager requires more than four transistors, then some of those additional transistors will show improved performance by having their own pump.

FIG. 3 is an exploded view of an exemplary 4T pixel of the present invention illustrated in FIG. 2A, where the pixel is formed using re-channel (n-ch) devices. Like components are labeled the same as in FIG. 2A. N+ type region 34 is actively driven by $V_{aa\text{-}pix}$ charge pump 100, which gets its supply of voltage (charge) from $V_{dd}$ 105. A $V_{aa\text{-}pix}$ charge pump allows the CMOS imager to operate at higher voltages and, thus, achieve better image performance. The $V_{aa\text{-}pix}$ charge pump permits lower voltage periphery and can be coupled with shorter transistor lengths to improve periphery performance. N+ type region 30 (floating diffusion node) is also supplied by $V_{aa\text{-}pix}$ charge pump 100 through N+ diffusion node 34 via reset transistor 31. Photodiode (PD) 26 is an n-type diffusion region. The n-ch devices are in a p-well. Substrate contact 20 may be ground (0V) or negative if a negative substrate pump is provided. The present invention also applies to an array containing n-ch transistors.

Figure 4:
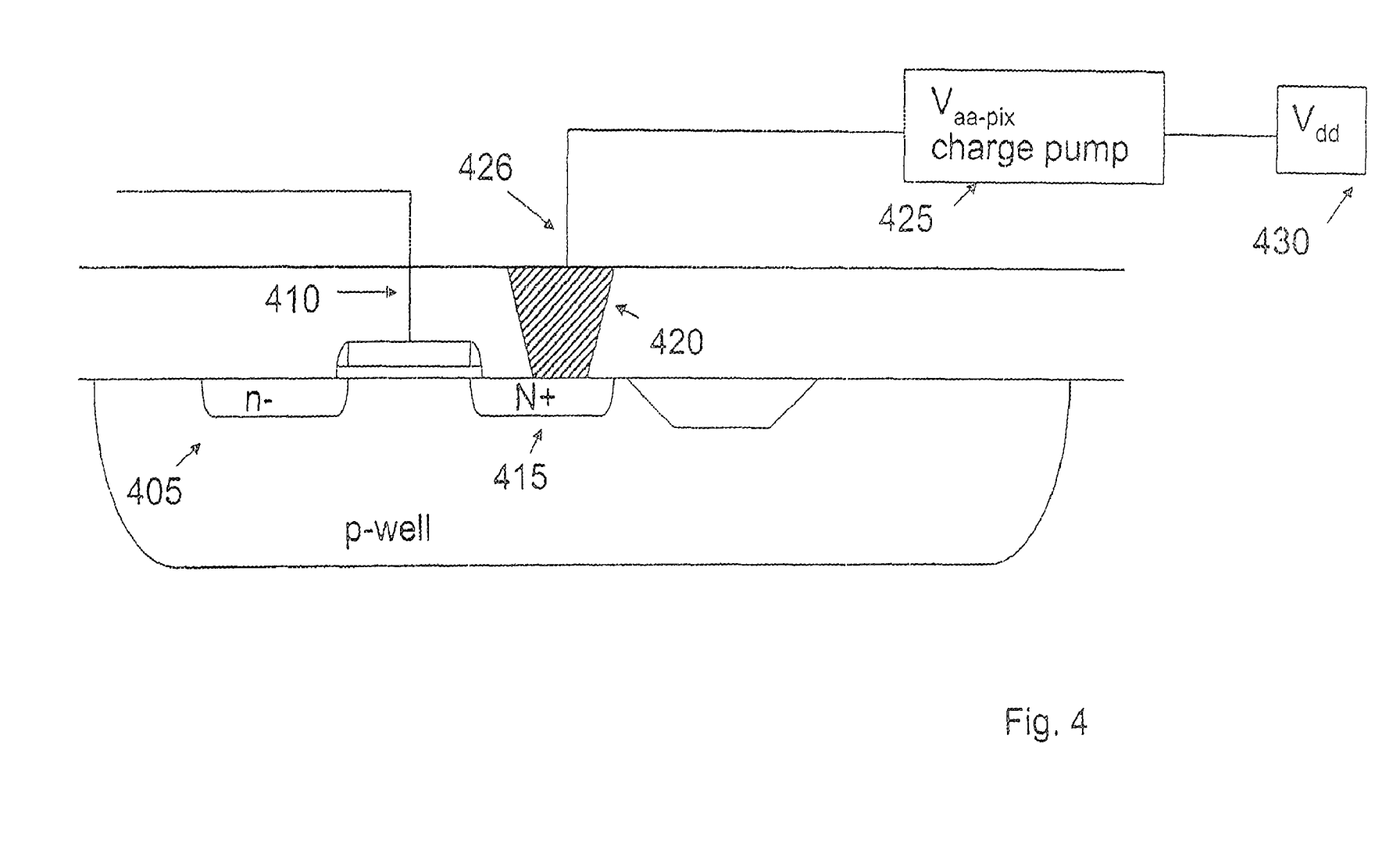
FIG. 4 is an exploded view of a 3T pixel using a $V_{aa\text{-}pix}$ charge pump in accordance with the present invention.

FIG. 4 is an exploded view of an exemplary 3T pixel of the present invention formed using n-ch devices. The 3T transistor pixel of FIG. 4 is similar to the 4T pixel of FIG. 3 except that there is no transfer transistor used in the 3T implementation. FIG. 4 is appropriate for a $V_{aa\text{-}pix}$ charge pump for any CMOS imager, 2T, 3T, 4T, 5T, or any type. PD 405 is n-type diffusion region, RST signal 410 controls a reset transistor formed by PD 405 and diffusion region 415, which is an n+ diffusion region. N+ diffusion region 420 is actively driven by $V_{aa\text{-}pix}$ charge pump 425, which gets its supply of voltage (charge) from $V_{dd}$ 430. The n-ch devices are in a p-well. The present invention also applies to an array containing p-ch transistors.

Figure 5:
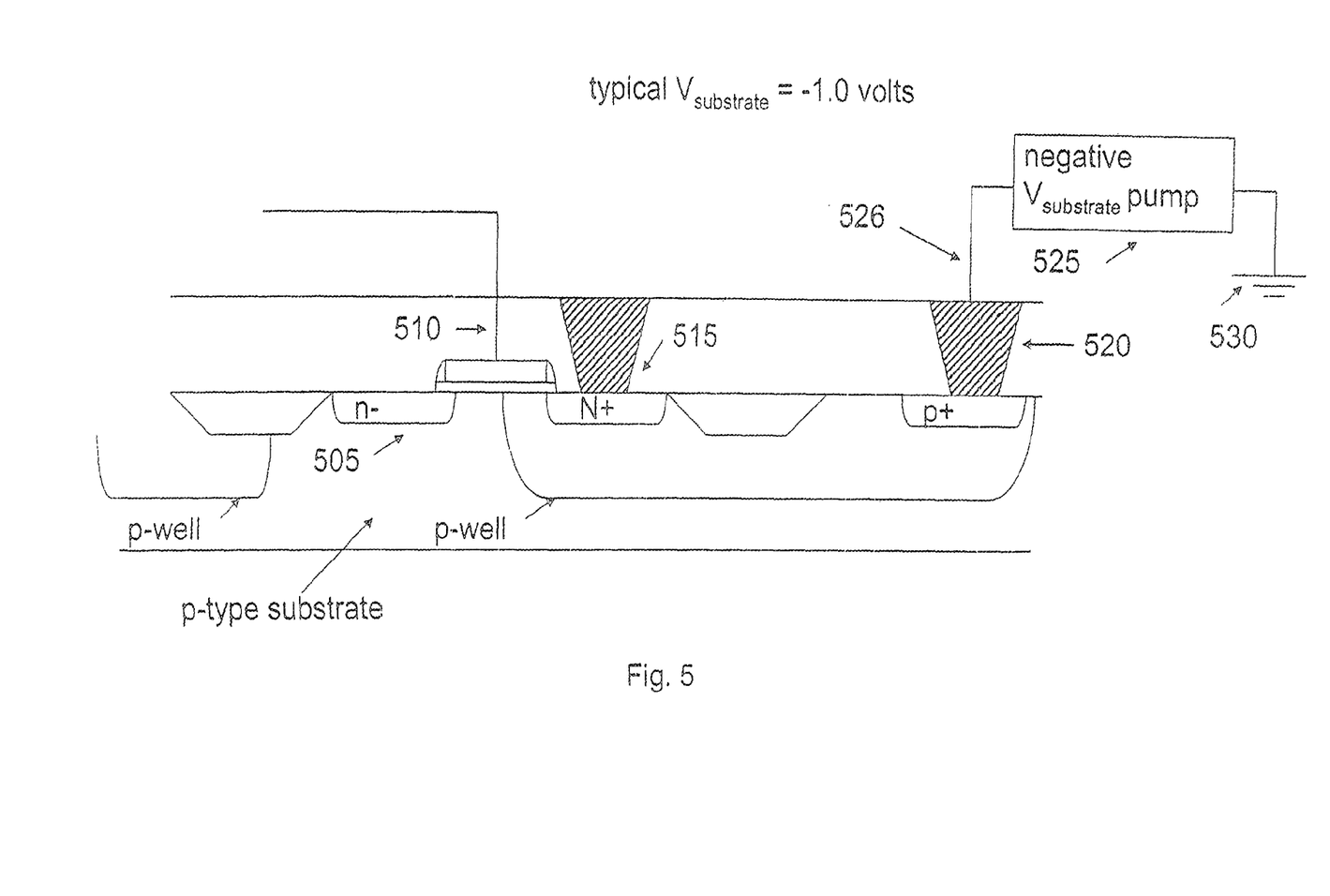
FIG. 5 is an exploded view of a 3T pixel using negative substrate pump in accordance with the present invention.

FIG. 5 is an exploded view of an exemplary 3T pixel using a negative substrate pump. The pixel is formed using n-ch devices. The PD 505 is diffusion n-type; diffusion region 515 is diffusion type n+. The diffusion region 520 under the substrate pump contact 526 is p+. Negative $V_{substrate}$ pump 525 is also connected to ground 530 and the external power supply, $V_{dd}$. Reset signal (RST) 510 controls the reset transistor formed by n-type diffusion region 505 and n+ diffusion region 515, which supplies $V_{aa\text{-}pi}$. The n-ch devices are in a p-well. All p-wells in the entire array are linked and the p-well attached to the negative substrate pump is connected to the array p-wells. The present invention also applies to an array containing p-ch transistors.

Figure 6A:
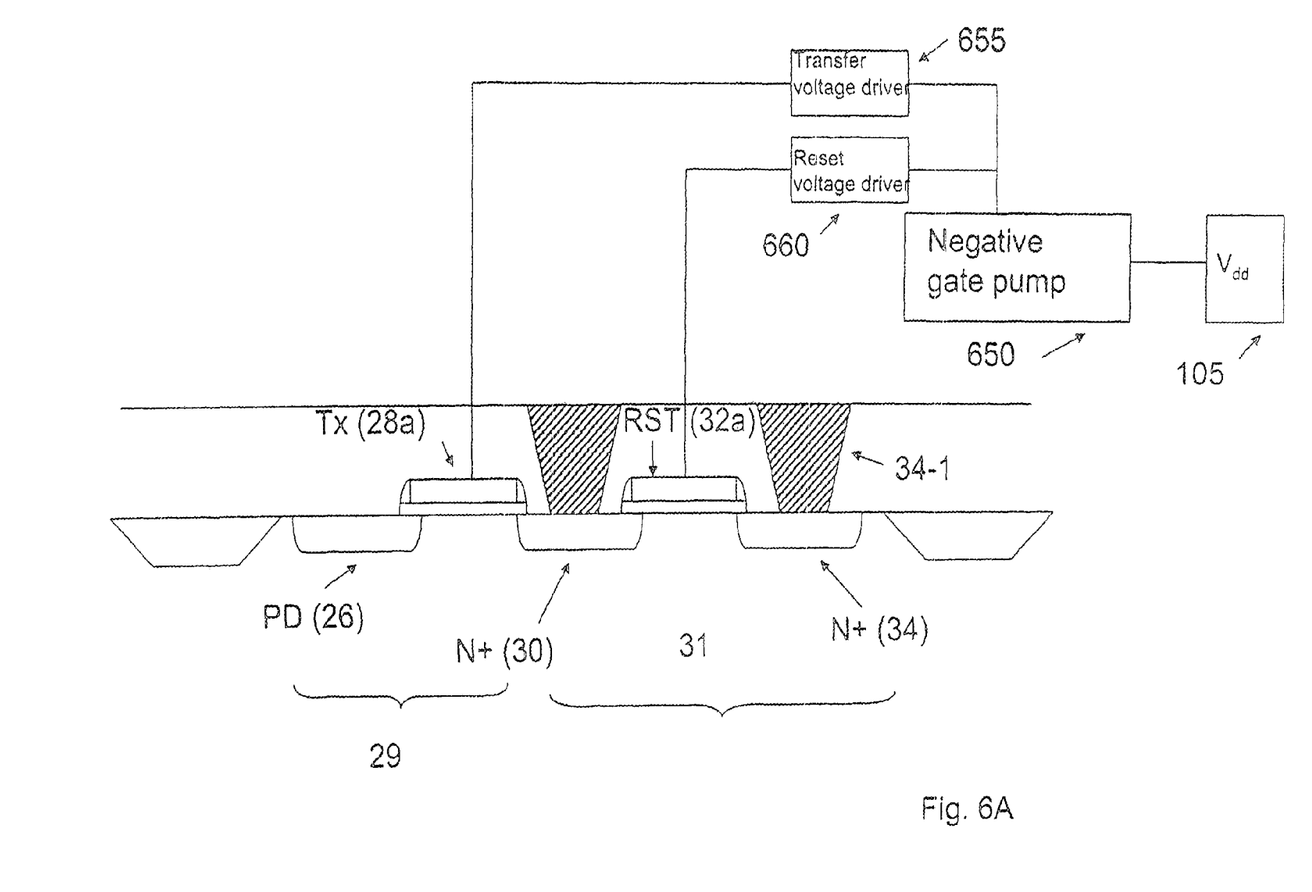
FIG. 6A is an exploded view of a 4T pixel using a negative gate pump in accordance with the present invention.
Figure 6B:
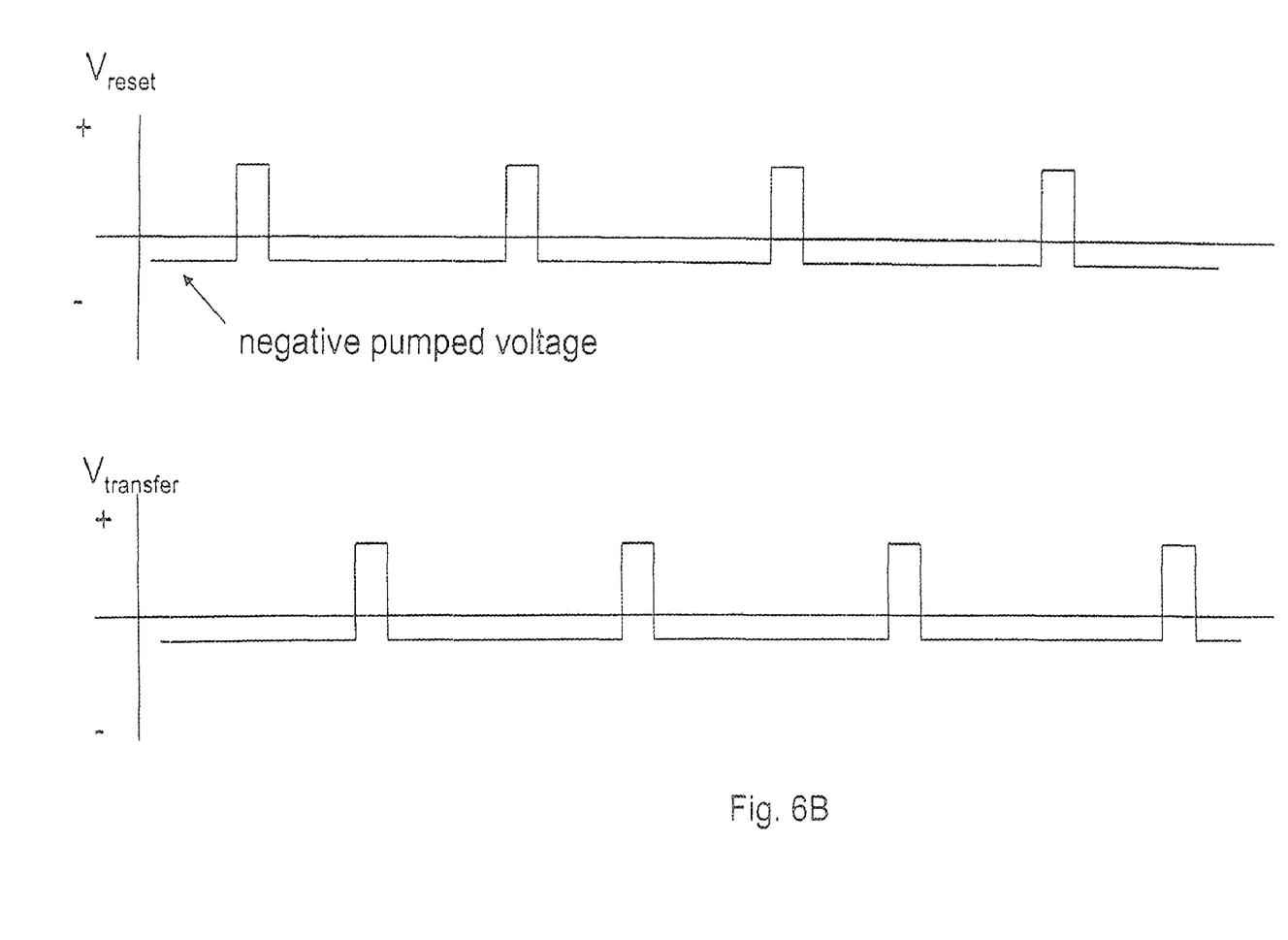
FIG. 6B is an example of a timing diagram for a reset gate and a transfer gate.

In another embodiment, a negative gate pump supplies a negative voltage, which is applied to gates such as reset and transfer gates. Specifically, FIG. 6A is an exploded view of a 4T pixel of the present invention, where the pixel is formed using n-ch devices. The gates (28a, 32a) of transfer transistor 29 and reset transistor 31 are driven by negative gate pump 650 via a transfer voltage driver 655 and a reset voltage driver 660 respectively. which gets it supply of voltage from $V_{dd}$ 105. Both the transfer gate and the reset gate could see a negative pumped off-state voltage but they would have separate clocks in that instance. In this embodiment, the negative gate pump operates to drive the gate "off" harder in n-ch devices. The negative gate pump could also be applied to the row select gate or any gate on a CMOS imager and is not limited by the exemplary embodiments described herein. Typical gates used in CMOS imagers include but are not limited to reset devices, transfer devices, global shutter devices, storage devices, high dynamic range devices and lateral overflow drain devices. FIG. 6B is an example of a timing diagram for a reset gate and a transfer gate. In each case, the gates are supplied with a negative pumped voltage.

Figure 7:
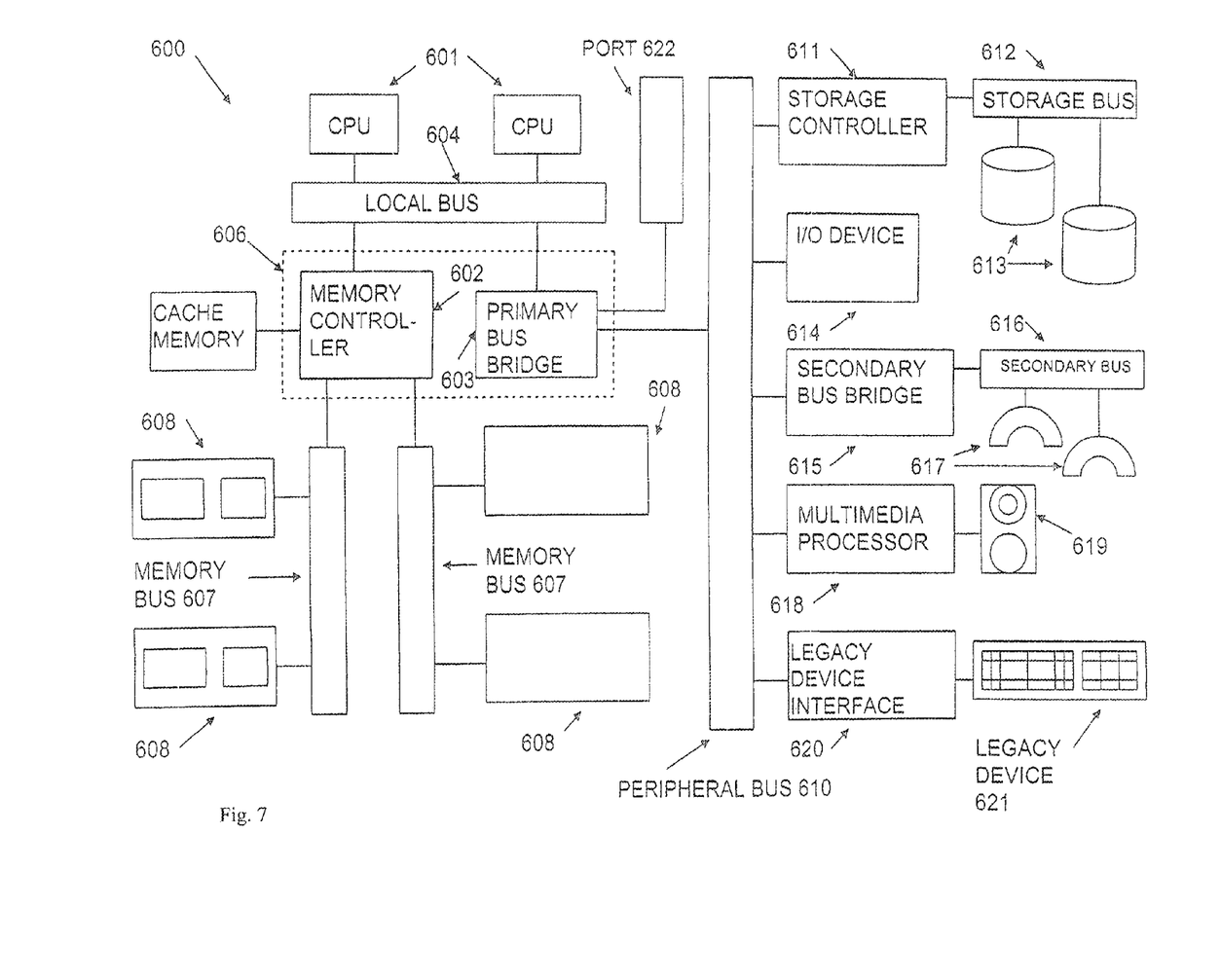
FIG. 7 is a processor system including a CMOS imager constructed in accordance with any of the embodiments of the present invention.

The present invention can be utilized within any integrated circuit which receives an input signal from an external source. FIG. 7 illustrates an exemplary processing system 600 which may utilize a processor circuit comprising a CMOS imager constructed in accordance with any of the embodiments of the present invention disclosed above in connections with FIGS. 1-6B. The processing system 600 includes one or more processors 601 coupled to a local bus 604. A memory controller 602 and a primary bus bridge 603 are also coupled the local bus 604. The processing system 600 may include multiple memory controllers 602 and/or multiple primary bus bridges 603. The memory controller 602 and the primary bus bridge 603 may be integrated as a single device 606.

The memory controller 602 is also coupled to one or more memory buses 607. Each memory bus accepts circuits such as 608 which include at least one pixel 631 using the present invention. The imaging device, e.g. a CMOS Imager, may also be integrated with a memory card or a memory module and a CPU in accordance with the present invention. Examples of memory modules include single inline memory modules (SIMMs) and dual inline memory modules (DIMMs). The imaging device 608 may include one or more additional devices 609 (not shown). For example, in a SIMM or DIMM, the additional device 609 might be a configuration memory, such as a serial presence detect (SPD) memory. The memory controller 602 may also be coupled to a cache memory 605. The cache memory 605 may be the only cache memory in the processing system. Alternatively, other devices, for example, processors 601 may also include cache memories, which may form a cache hierarchy with cache memory 605. If the processing system 600 include peripherals or controllers which are bus masters or which support direct memory access (DMA), the memory controller 602 may implement a cache coherency protocol. If the memory controller 602 is coupled to a plurality of memory buses 607, each memory bus 607 may be operated in parallel, or different address ranges may be mapped to different memory buses 607.

The primary bus bridge 603 is coupled to at least one peripheral bus 610. Various devices, such as peripherals or additional bus bridges may be coupled to the peripheral bus 610. These devices may include a storage controller 611, an miscellaneous I/O device 614, a secondary bus bridge 615, a multimedia processor 618, and an legacy device interface 620. The primary bus bridge 603 may also coupled to one or more special purpose high speed ports 622. In a personal computer, for example, the special purpose port might be the Accelerated Graphics Port (AGP), used to couple a high performance video card to the processing system 600.

The storage controller 611 couples one or more storage devices 613, via a storage bus 612, to the peripheral bus 610. For example, the storage controller 611 may be a SCSI controller and storage devices 613 may be SCSI discs. The I/O device 614 may be any sort of peripheral. For example, the I/O device 614 may be an local area network interface, such as an Ethernet card. The secondary bus bridge may be used to interface additional devices via another bus to the processing system. For example, the secondary bus bridge 616 may be an universal serial port (USB) controller used to couple USB bus devices 617 via to the processing system 600. The multimedia processor 618 may be a sound card, a video capture card, or any other type of media interface, which may also be coupled to one additional devices such as speakers 619. The legacy device interface 620 is used to couple legacy devices, for example, older styled keyboards and mice, to the processing system 600. In addition to pixel 631 which may contain a pump circuit of the present invention multimedia processor 681 of FIG. 7 may also utilize an imaging device of the present invention including the CPU 601.

The processing system 600 illustrated in FIG. 7 is only an exemplary processing system with which the invention may be used. While FIG. 7 illustrates a processing architecture especially suitable for a general purpose computer, such as a personal computer or a workstation, it should be recognized that well known modifications can be made to configure the processing system 600 to become more suitable for use in a variety of applications. For example, many electronic devices which require processing may be implemented using a simpler architecture which relies on a CPU 601 coupled to imaging device 608 and/or memory buffer devices 604. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

In another embodiment, a negative pump supplies a negative voltage, which is applied to gates such as reset and transfer gates. In this embodiment, the negative pump operates to drive the gate "off" harder in n-ch devices.

In an alternative embodiment, a positive pump supplies a positive voltage, which is applied to gates such as reset and transfer gates. In this embodiment, the positive pump operates to drive the gate "off" harder in p-ch devices.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

The invention claimed is:

1. A method of operating a pixel cell of an imaging device, said method comprising:
 receiving an external supply voltage;
 applying a first pumped voltage based on the received external supply voltage to a first gate to store photo-generated charges at a storage node;
 applying a second pumped voltage based on the received external supply voltage to a second gate to produce a pixel output signal from the stored photo-generated charges; and
 applying a third pumped voltage based on the received external supply voltage to a portion of the pixel cell to operate as an operating voltage of the pixel cell.

2. The method of claim 1, wherein the first and second pumped voltages are respectively generated using first and second pump circuits connected to the external supply voltage.

3. The method of claim 1, wherein one of the first or second pumped voltages is regulated to a voltage less than the external supply voltage.

4. The method of claim 1, wherein one of the first or second pumped voltages is negative, being less than a ground reference voltage.

5. The method of claim 1, wherein the first gate is part of an n-channel device and the first pumped voltage is applied to an n+ diffusion region of the n-channel device.

6. The method of claim 1, wherein the second gate is part of an n-channel device and the second pumped voltage is applied to an n+ diffusion region of the n-channel device.

7. The method of claim 1, wherein the first gate is part of a p-channel device and the first pumped voltage is applied to a p+ diffusion region of the p-channel device.

8. The method of claim 1, wherein the second gate is part of a p-channel device and the second pumped voltage is applied to a p+ diffusion region of the p-channel device.

9. The method of claim 1, further comprising applying a fourth pumped voltage based on the received external supply voltage to a third gate to reset the storage node.

10. The method of claim 1, further comprising generating a pumped supply voltage from a negative substrate pump.

11. The method of claim 1, further comprising generating a pumped supply voltage from a positive substrate pump.

12. A method of operating a pixel cell of an imaging device, said method comprising:
 generating a pumped supply voltage from a substrate pump;
 applying the pumped supply voltage to a portion of the pixel cell to operate as an operating voltage of the pixel cell;
 applying a first pumped control voltage to a first gate to store photo-generated charges at a storage node;
 applying a second pumped control voltage to a second gate to produce a pixel output signal from the stored photo-generated charges; and
 applying a third pumped control voltage to a third gate to reset the storage node.

13. The method of claim 12, wherein the first, second and third pumped control voltages are respectively generated using first, second and third pump circuits connected to an external supply voltage.

14. The method of claim 12, wherein one of the first, second or third pumped control voltages is regulated to a voltage less than an external supply voltage.

15. The method of claim 12, wherein one of the first, second or third pumped control voltages is negative, being less than a ground reference voltage.

16. The method of claim 12, wherein the first gate is part of an n-channel device and the first pumped control voltage is applied to an n+ diffusion region of the n-channel device.

17. The method of claim 12, wherein the second gate is part of an n-channel device and the second pumped control voltage is applied to an n+ diffusion region of the n-channel device.

18. The method of claim 12, wherein the third gate is part of an n-channel device and the third pumped control voltage is applied to an n+diffusion region of the n-channel device.

19. The method of claim 12, wherein the first gate is part of a p-channel device and the first pumped control voltage is applied to a p+ diffusion region of the p-channel device.

20. The method of claim 12, wherein the second gate is part of a p-channel device and the second pumped control voltage is applied to a p+ diffusion region of the p-channel device.

21. The method of claim 12, wherein the third gate is part of a p-channel device and the third pumped control voltage is applied to a p+ diffusion region of the p-channel device.

22. The method of claim 12, wherein the pumped supply voltage is generated from a negative substrate pump.

23. The method of claim 12, wherein the pumped supply voltage is generated from a positive substrate pump.

24. A method of operating a pixel cell of an imaging device, said method comprising:
- receiving an external supply voltage;
- applying a first pumped voltage based on the received external supply voltage to a first gate to reset a storage node;
- applying a second pumped voltage based on the received external supply voltage to a second gate to transfer photo-generated charges to the storage node; and
- applying a third pumped voltage based on the received external supply voltage to a portion of the pixel cell to operate as an operating voltage of the pixel cell.

25. The method of claim 24, further comprising:
- applying a fourth pumped voltage based on the received external supply voltage to a third gate to produce a pixel output signal from the stored photo-generated charges.

26. The method of claim 24, further comprising:
- applying a fourth pumped voltage based on the received external supply voltage to a third gate to drain away excess photo-generated charges.

* * * * *